United States Patent
Chikenji et al.

(10) Patent No.: US 7,392,697 B2
(45) Date of Patent: Jul. 1, 2008

(54) APPARATUS FOR DOWNHOLE FLUIDS ANALYSIS UTILIZING MICRO ELECTRO MECHANICAL SYSTEM (MEMS) OR OTHER SENSORS

(75) Inventors: Akihito Chikenji, Paris (FR); Veronique Nouaze, Plessis Robinson (FR); Tsutomu Yamate, Yokohama (JP); Toru Terabayashi, Sagamihara (JP); Tsutomu Sugimoto, Shiga-ken (JP)

(73) Assignee: Schlumberger Technology Corporation, Sugar Land, TX (US)

( * ) Notice: Subject to any disclaimer, the term of this patent is extended or adjusted under 35 U.S.C. 154(b) by 2 days.

(21) Appl. No.: 11/230,793

(22) Filed: Sep. 19, 2005

(65) Prior Publication Data

US 2007/0062274 A1    Mar. 22, 2007

(51) Int. Cl.
  *E21B 47/06* (2006.01)
(52) U.S. Cl. ................ 73/152.55; 73/152.54; 73/152.46
(58) Field of Classification Search .............. 73/152.55, 73/152.01, 152.54, 152.46
  See application file for complete search history.

(56) References Cited

U.S. PATENT DOCUMENTS

| | | | |
|---|---|---|---|
| 3,189,095 A * | 6/1965 | De Rochemont | 166/120 |
| 3,780,575 A | 12/1973 | Urbanosky | |
| 3,859,851 A | 1/1975 | Urbanosky | |
| 4,860,581 A | 8/1989 | Zimmerman et al. | |
| 4,994,671 A | 2/1991 | Safinya et al. | |
| 5,167,149 A | 12/1992 | Mullins et al. | |
| 5,201,220 A | 4/1993 | Mullins et al. | |
| 5,266,800 A | 11/1993 | Mullins | |
| 5,331,156 A | 7/1994 | Hines | |
| 6,384,473 B1 * | 5/2002 | Peterson et al. | 257/680 |
| 6,489,670 B1 * | 12/2002 | Peterson et al. | 257/686 |
| 6,495,895 B1 * | 12/2002 | Peterson et al. | 257/434 |
| 6,531,341 B1 * | 3/2003 | Peterson et al. | 438/123 |
| 6,538,312 B1 * | 3/2003 | Peterson et al. | 257/680 |
| 6,590,647 B2 * | 7/2003 | Stephenson | 356/301 |
| 6,681,633 B2 * | 1/2004 | Schultz et al. | 73/587 |
| 6,915,848 B2 * | 7/2005 | Thomeer et al. | 166/250.11 |
| 6,928,864 B1 * | 8/2005 | Henry et al. | 73/152.54 |
| 6,976,386 B1 * | 12/2005 | Grover et al. | 73/73 |
| 7,017,662 B2 * | 3/2006 | Schultz et al. | 166/254.2 |
| 7,116,542 B2 * | 10/2006 | Lerche et al. | 361/248 |
| 2002/0163639 A1 | 11/2002 | Stephenson | 356/301 |
| 2002/0194906 A1 * | 12/2002 | Goodwin et al. | 73/152.46 |
| 2003/0033866 A1 * | 2/2003 | Diakonov et al. | 73/152.55 |
| 2004/0160726 A1 * | 8/2004 | Lerche et al. | 361/233 |
| 2005/0099618 A1 * | 5/2005 | DiFoggio et al. | 356/70 |

FOREIGN PATENT DOCUMENTS

DE  19510447 A1  8/1996
WO  WO 02/077613 A  10/2002

* cited by examiner

*Primary Examiner*—Hezron E. Williams
*Assistant Examiner*—Rodney T Frank
(74) *Attorney, Agent, or Firm*—Matthias Abrell; Jaime Castano; Dale Gaudier

(57) ABSTRACT

The present invention provides packaging for MEMS devices and other sensors for downhole application. The MEMS devices and/or other sensors may aid in characterizing formation fluids in situ. The packaging facilitates high temperature, high pressure use, which is often encountered in downhole environments.

24 Claims, 5 Drawing Sheets

APPARATUS FOR DOWNHOLE FLUIDS ANALYSIS UTILIZING MICRO ELECTRO MECHANICAL SYSTEM (MEMS) OR OTHER SENSORS

FIELD OF THE INVENTION

The present invention relates generally to downhole fluid analysis applicable to formation evaluation and testing in the exploration and development of hydrocarbon-producing wells such as oil or gas wells. More particularly, the invention provides apparatus for performing downhole analysis on fluids produced in such wells using micro electro mechanical systems (MEMS) or other sensors.

BACKGROUND OF THE INVENTION

In order to evaluate the nature of underground formations surrounding a borehole, it is often desirable to obtain samples of formation fluids from various specific locations in a borehole. Tools have been developed which allow several samples to be taken from the formation in a single logging run. Examples of such tools can be found in U.S. Pat. Nos. 3,780,575 and 3,859,851.

Schlumberger's RFT and MDT tools represent two specific versions of sampling tools. In particular, the MDT tool includes a fluid analysis module to allow analysis of fluids sampled by the tool. FIG. 1 illustrates a schematic diagram of such a downhole tool 10 for testing earth formations and analyzing the composition of fluids from the formation. The downhole tool 10 is suspended in a borehole 12 from a logging cable 15 that is connected in a conventional fashion to a surface system 18 incorporating appropriate electronics and processing systems for control of the tool and analysis of signals received from the downhole tool 10. The downhole tool 10 includes an elongated body 19 which encloses a downhole portion of a tool control system 16. The elongated body 19 also carries a selectively extendible fluid admitting assembly 20 (for example as shown in the '575 and '851 patents referenced above, and as described in U.S. Pat. No. 4,860,581, incorporated herein by reference) and a selectively extendible anchoring member 21, which are respectively arranged on opposite sides of the elongated body 19. The fluid admitting or withdrawal assembly 20 is equipped for selectively sealing off or isolating portions of the wall of the borehole 12 such that pressure or fluid communication with the adjacent earth formation is established. A fluid analysis module 25 is also included within the elongated tool body 19, through which the obtained fluid flows. The fluid can then be expelled through a port (not shown) back into the borehole, or it can be sent to one or more sample chambers 22, 23 for recovery at the surface. Control of the fluid withdrawal assembly, the fluid analysis section and the flow path to the sample chambers is maintained by the electrical control systems 16, 18.

An optical fluid analyzer (OFA), which may be located in the fluid analysis module 25, may identify the fluids in the flow stream and quantify the oil and water content. U.S. Pat. No. 4,994,671 (incorporated herein by reference) describes a borehole apparatus which includes a testing chamber, a light source, a spectral detector, a database, and a processor. Fluids drawn from the formation into the testing chamber are analyzed by directing the light at the fluids, detecting the spectrum of the transmitted and/or backscattered light, and processing the information (based on information in the database relating to different spectra), in order to characterize the formation fluids.

In addition, U.S. Pat. Nos. 5,167,149, and 5,201,220 (both incorporated by reference herein) describe apparatus for estimating the quantity of gas present in a fluid stream. A prism is attached to a window in the fluid stream and light is directed through the prism to the window. Light reflected from the window/fluid flow interface at certain specific angles is detected and analyzed to indicate the presence of gas in the fluid flow.

As set forth in U.S. Pat. No. 5,266,800 (incorporated herein by reference), monitoring optical absorption spectrum of fluid samples obtained over time may allow one to determine when formation fluids, rather than mud filtrates, are flowing into the fluid analysis module 25. Further, as described in U.S. Pat. No. 5,331,156 to Hines, by making optical density (OD) measurements of the fluid stream at certain predetermined energies, oil and water fractions of a two-phase fluid stream may be quantified.

In addition or alternative to the optical fluid analyses described above, the in situ measurement of other formation fluid properties may be desired. For example, for fluid samples that will be returned to the surface for further analysis, it may be important to precisely measure the density, viscosity, temperature, and pressure of a fluid sample downhole. During transportation of a sample bottle from a field location to a laboratory, the fluid properties may change due to differences in pressure and temperature. The in situ conditions must be precisely known in order to duplicate the conditions in a laboratory for full and accurate sample analysis. However, current downhole analysis equipment associated with fluid sample characteristic measurements is quite large and requires significant power resources. Moreover, space and power are at a premium in a downhole tool, and therefore the smaller and more power efficient the equipment, the better.

The present invention is directed to improving, or at least reducing the effects of, one or more of the problems identified above.

SUMMARY OF THE INVENTION

The present invention addresses the above-described deficiencies and others. Specifically, the present invention provides MEMS or sensor packaging suitable for downhole application. According to one aspect of the present invention, a MEMS or sensor package comprises a structural shell, a ceramic printed circuit board at least partially disposed in the structural shell, a sensor attached and electrically connected to the ceramic printed circuit board, and a first annular seal disposed between the ceramic printed circuit board and the structural shell. The structural shell may comprise an internal recess, such that the first annular seal is disposed in the internal recess. Pressure at the sensor may tend to tighten the first annular seal.

According to some embodiments of the present invention, the ceramic printed circuit board may comprise a first or high pressure end, and the sensor may be a MEMS device and may be attached to the first end. The ceramic printed circuit board may also comprise a second or low pressure end having electrical pads. The ceramic printed circuit board may comprise a cylindrical central portion, the cylindrical central portion comprising a first diameter adjacent to the first end, a second diameter adjacent to the second end, and a transition shoulder. The structural shell may comprise an internal shoulder, and the internal shoulder may bear against the transition shoulder of the ceramic printed circuit board.

According to some aspects of the present invention, the ceramic printed circuit board comprises a cylindrical middle portion, a step disposed in a first end and attached to the sensor, and a flat landing disposed in a second end and extending out of the structural shell. The flat landing may comprise one or more standard PCB electrical pads or leads. Interfering shoulders may be disposed in the ceramic printed circuit board and the structural shell. Pressure at the sensor may force the interfering shoulders together.

According to some embodiments, the sensor extends outside of the structural shell. A cap may be disposed over the sensor. The cap may overlap with the structural shell and include at least one hole. The at least one hole may comprise a lateral hole extending through the cap, and an end hole in the cap.

Some embodiments of the package comprise bonding wires connected between the sensor and the ceramic printed circuit board. The bonding wires may be covered or filled in with an insulating material. Some embodiments of the MEMS or sensor package comprise a flip chip connection between the sensor and the ceramic printed circuit board.

An external circumferential seal may be disposed in the structural shell.

The sensor may comprise one or more of a temperature sensor, a density sensor, a pressure sensor, a viscosity sensor, an optical sensor, and a chemical sensor.

Another aspect of the present invention provides an apparatus for analyzing fluids in a formation surrounding a borehole. The apparatus comprises a subterranean fluid analysis tool comprising a fluid analysis module, and a MEMS sensor disposed in the fluid analysis module. The MEMS sensor may be contained by a MEMS package. The MEMS package may comprise a structural shell, a ceramic printed circuit board at least partially disposed in the structural shell and electrically connected to the MEMS sensor, and a first annular seal disposed between the ceramic printed circuit board and the structural shell. The first annular seal is adapted to isolate a first portion of the ceramic circuit printed circuit board that is attached to the MEMS sensor from a second portion of the ceramic printed circuit board across pressures differences of up to at least ten Kpsi. The MEMS sensor may be adapted to operate at pressures of up to at least twenty-five Kpsi and temperatures up to at least two-hundred degrees C. The MEMS sensor may be inserted across a high pressure seal isolating the MEMS sensor from MEMS sensor electrical contact pads.

According to some embodiments, the subterranean fluid analysis tool comprises a fluid sample withdrawal system. The subterranean fluid analysis tool may establish fluid communication between formation fluids and the MEMS sensor.

Another embodiment of the present invention provides a high temperature, high pressure downhole sensor, comprising a generally cylindrical ceramic circuit board having first and second portions and a first shoulder, a MEMS sensor attached to the first portion for exposure to a high pressure subterranean environment, an electrical component section attached to the second portion and exposed to atmospheric pressure, a shell housing the ceramic circuit board and having a second shoulder bearing against the first shoulder of the ceramic circuit board, a seal isolating the first portion from the second portion, and a cap having a hole covering the MEMS sensor. The generally cylindrical ceramic circuit board may comprise a flat planar section comprising electrical pads or leads disposed in the second portion. The MEMS sensor may be attached to the generally cylindrical ceramic circuit board with wire bonds, and the wire bonds may be filled or covered with an electrical insulating material.

Another aspect of the present invention provides a method of analyzing a subterranean formation fluid. The method comprises establishing fluid communication between a MEMS sensor and subterranean formation fluids in a borehole, and communicating information from the MEMS sensor to a processor. The processor may be located at a surface location. The method may further comprise packaging the MEMS sensor in a removable cartridge and inserting the removable cartridge into a downhole tool. The method may include electrically connecting the MEMS sensor to a generally cylindrical ceramic circuit board, inserting the generally cylindrical ceramic circuit board into a shell, and sealing a first annulus between the generally cylindrical ceramic circuit board and the shell. The method may comprise capping the shell over the MEMS sensor. The method may include sealing a second annulus between the shell and a downhole tool.

Additional advantages and novel features of the invention will be set forth in the description which follows or may be learned by those skilled in the art through reading these materials or practicing the invention. The advantages of the invention may be achieved through the means recited in the attached claims.

BRIEF DESCRIPTION OF THE DRAWINGS

The accompanying drawings illustrate preferred embodiments of the present invention and are a part of the specification. Together with the following description, the drawings demonstrate and explain the principles of the present invention.

Figure 1:
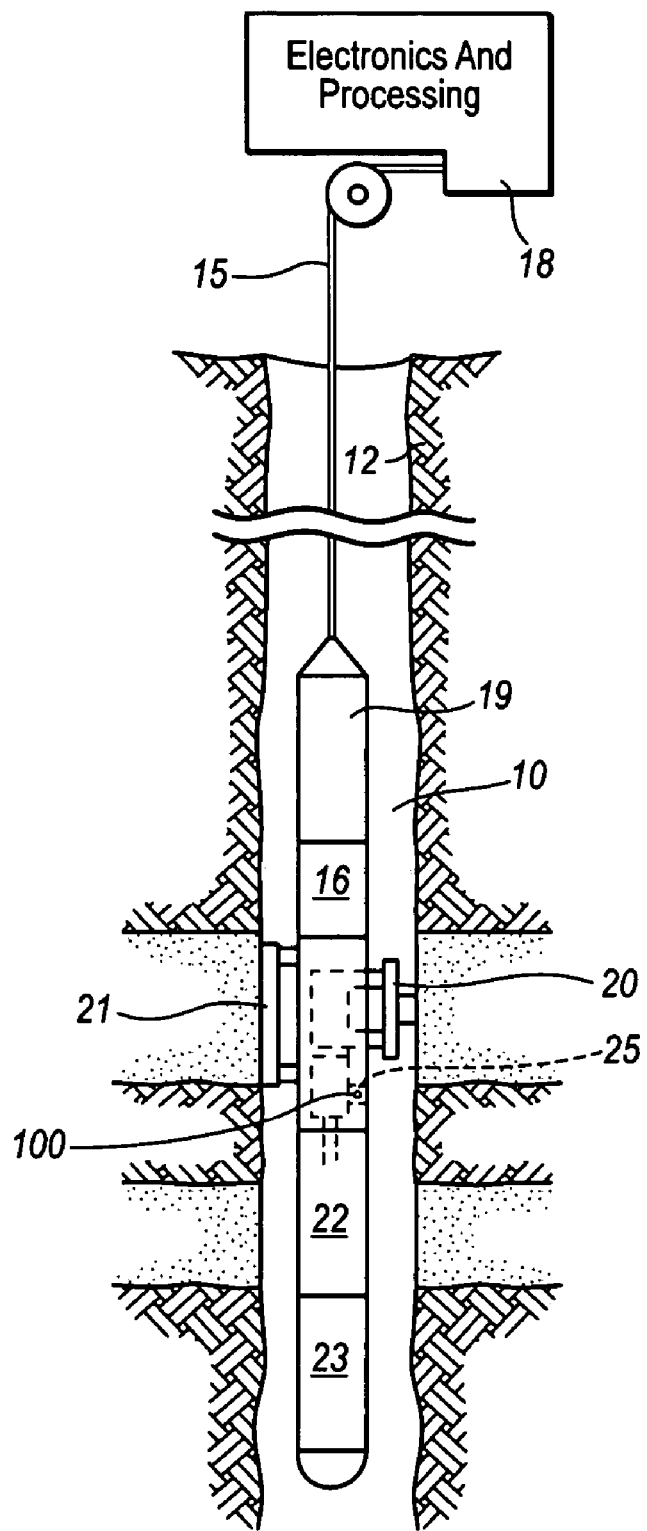
FIG. 1 shows a subterranean borehole tool deployed in a borehole and including a fluid analysis module containing a MEMS device or other sensor according to one embodiment of the present invention.

Throughout the drawings, identical reference numbers and descriptions indicate similar, but not necessarily identical elements. While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the scope of the invention as defined by the appended claims.

DETAILED DESCRIPTION OF THE PREFERRED EMBODIMENTS

Illustrative embodiments and aspects of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, that will vary from one implementation to another. Moreover, it will be appreciated that such a development effort might be complex and time-consuming, but would nevertheless be a routine undertaking for those of ordinary skill in the art having the benefit of this disclosure.

The present invention contemplates methods and apparatus for precisely measuring fluid properties using MEMS devices or other sensors under downhole conditions. Downhole conditions are generally referred to as "high temperature, high pressure" environments, which may include temperatures of up to about two-hundred degrees Celsius (C) or more, and pressures of about ten to twenty-five Kpsi or more. The principles described herein facilitate the use of MEMS devices in any downhole or high temperature, high pressure environment.

As used throughout the specification and claims, the term "downhole" refers to a subterranean environment, particularly in a wellbore. "Downhole tool" is used broadly to mean any tool used in a subterranean environment including, but not limited to, a logging tool, a sampling tool, an imaging tool, an acoustic tool, a temperature sensor, a pressure sensor, and a combination tool. A "fluid" refers to a continuous, amorphous substance whose molecules move freely past one another and that has the tendency to assume the shape of its container. A "MEMS" device or a MEMS sensor refers to any micro electro mechanical system. A "sensor" refers to any device that may be used to measure or sense temperature, pressure, density, viscosity, chemical composition, and/or other characteristics of matter, and includes mechanical, electrical, optical, and chemical sensors. "Low pressure" means anything less than the "high pressure" defined above, especially atmospheric pressure.

Turning now to the FIGS., and in particular to FIG. 1, the downhole tool 10, which may be a subterranean fluid analysis tool, includes a sensor package, for example MEMS or sensor package 100 (FIG. 2), in the fluid analysis module 25. The downhole tool 10 is representative of any downhole tool, including sampling tools, logging tools, measurement while drilling (MWD) and logging while drilling (LWD) tools that make formation fluid measurements, and others. The embodiment of the downhole tool 10, is, therefore, not limiting. Any downhole tool may be configured for use with MEMS packages or other sensor packages in accordance with principles described herein.

The MEMS or sensor package 100 (FIG. 2) is too small to show in any detail with reference to the entire downhole tool 10. However, the MEMS or sensor package 100 is shown in detail in FIGS. 2-6. The MEMS or sensor package shown and described in FIGS. 2-6 is adapted for use in subterranean environments and others.

Referring next to FIGS. 2-6, the MEMS or sensor package 100 comprises a structural shell 102 (FIG. 3) housing at least a portion of a printed circuit board, for example a ceramic printed circuit board 104 shown in FIGS. 2-6. The structural shell 102 may comprise stainless steel or other material and may include a number of internal and external features described below. The structural shell 102 is generally cylindrical but may include a number of changes in diameter or other shapes. For example, a first end 106 of the structural shell 102 may include a first diameter. A first shoulder or taper 108 transitions the outer diameter of the structural shell 102 to a second portion 110 having a second diameter which is larger than the first diameter. The second portion 110 of the structural shell 102 may include a recess 112 (FIG. 3) receptive of a external circumferential seal such as an O-ring seal 114. A second shoulder or taper 116 transitions the outer diameter of the structural shell 102 to a third portion 118. The outer diameter of the third portion 118 is larger than the outer diameter of the second portion 110. The third portion 118 may include first and second recesses 120, 122 for aligning a MEMS device or other sensor 142 (discussed below with reference to FIGS. 3-4) with the ceramic printed circuit board 104. Therefore, the recesses 120, 122 ensure that the MEMS package 100 is inserted into the fluid analysis module 25 (FIG. 1) (or a tool in parallel with the module 25) in a certain orientation and function as a guide or setting key.

Figure 3:
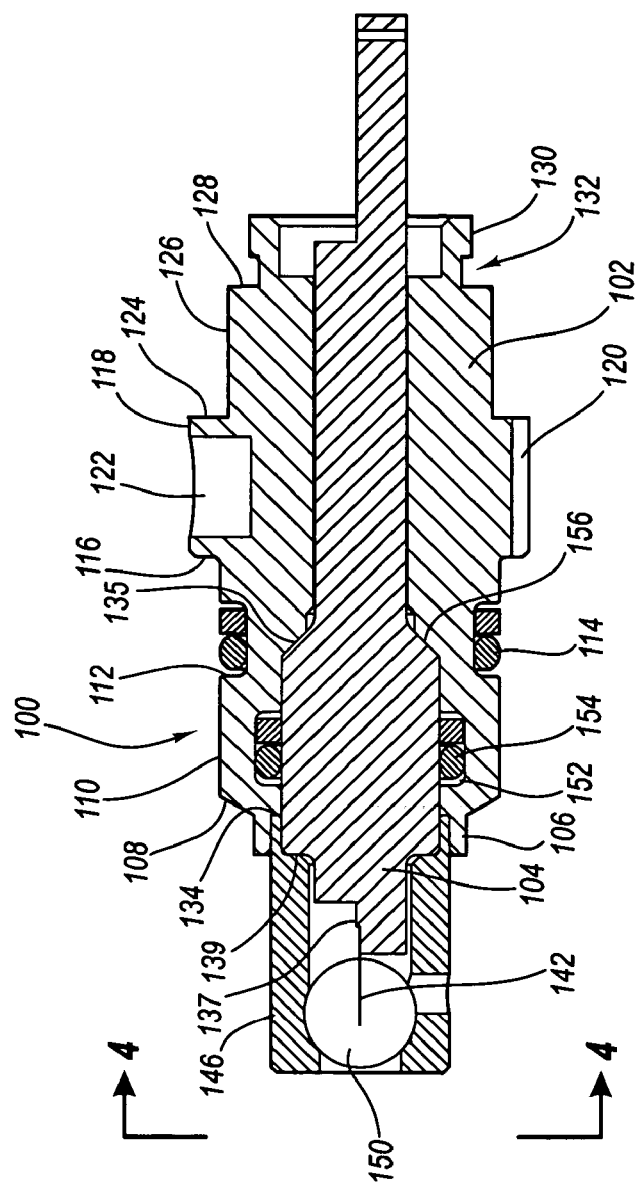
FIG. 3 is a cross-sectional view of the assembled MEMS or sensor package of FIG. 2 according to one embodiment of the present invention.
Figure 4:
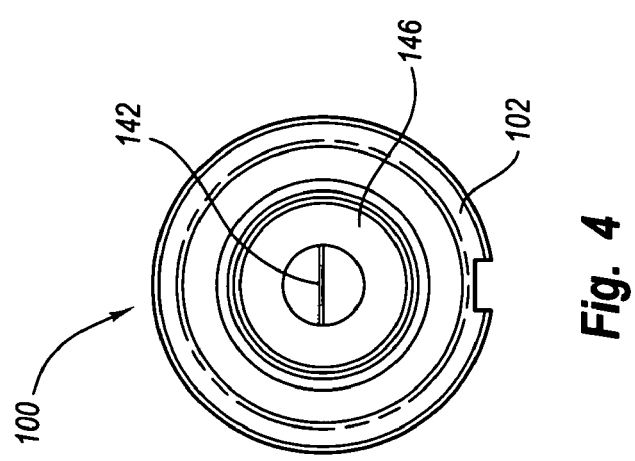
FIG. 4 is an end view of the assembled MEMS or sensor package of FIG. 2 according to one embodiment of the present invention.
Figure 5:
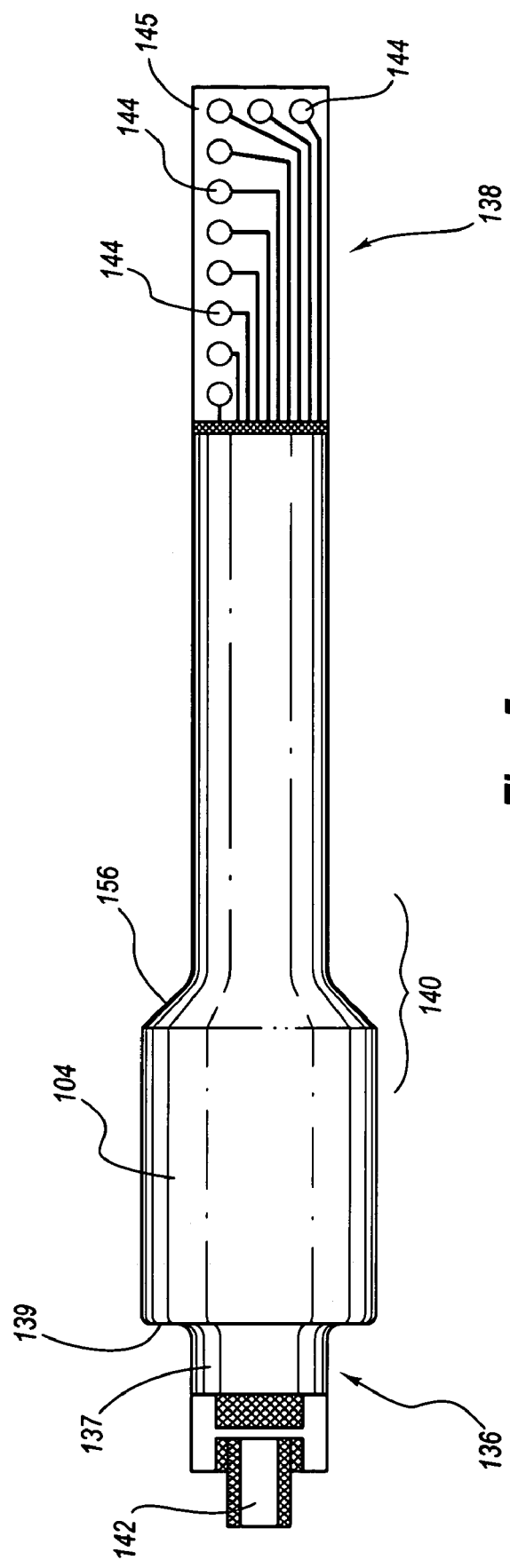
FIG. 5 is a side view of a MEMS device and a ceramic printed circuit board according to one embodiment of the present invention.

A third shoulder or taper 124 transitions the outer diameter of the structural shell 102 from the third portion 118 to a fourth portion 126. The outer diameter of fourth portion 126 is smaller than the outer diameter of the third portion 118, and may be substantially the same as the outer diameter of the second portion 110. A fourth shoulder or taper 128 transitions the outer diameter of the structural shell 102 from the fourth portion 126 to a fifth portion 130 (FIG. 3). The fifth portion 130 (FIG. 3) may include a recess 132 (FIG. 3). The recess 132 (FIG. 3) may be used to remove the MEMS or sensor package 100 from the module 25 (FIG. 1) as a grappling groove. The outer diameter of the fifth portion 130 (FIG. 3) is smaller than the outer diameter at the fourth portion 126. The structural shell may also include a first internal shoulder 134 (FIG. 3) and a second internal shoulder 135 (FIG. 3).

As mentioned above, the structural shell 102 houses at least a portion of the ceramic printed circuit board 104. The ceramic printed circuit board 104, however, is generally cylindrical as shown most clearly in FIG. 5. The ceramic printed circuit board 104 includes a first end 136, a second end 138, and a cylindrical central portion 140. The first end 136 may include a step 137 and is electrically connected to and attached to the sensor 142. The sensor 142 may comprise a MEMS device, and may include, but is not limited to, a pressure sensor, a temperature sensor, a viscosity sensor, an optical sensor, and a chemical sensor, each of which is available from commercial sources. Any sensor may be electrically connected to the ceramic printed circuit board 104. The sensor 142 of FIGS. 2-6 may be a MEMS device and may measure approximately 2 mm by 5 mm by 0.02 mm, which is orders of magnitude smaller than any conventional sensors used on current downhole tools and requires only a fraction of the power used by conventional downhole sensors.

According to some embodiments, the sensor 142 is electrically connected to the ceramic printed circuit board 104 at the first end 136 by wire bonds. Moreover, the wire bonds may be covered by or filled in with an electrically insulating material such as molding glue or low melting point glass. Filling over and between the wire bonds may prevent them from detaching and protect them from exposure to downhole fluids. According to some embodiments, the sensor 142 comprises a semiconductor chip and may be flip chip connected to the ceramic printed circuit board 104 and covered with an insulator. According to some embodiments, the sensor 142 is a MEMS sensor with moving parts, and according to others the sensor 142 has no moving parts, such as an optical or chemical sensor.

The second end 138 of the ceramic printed circuit board 104 comprises a generally flat landing or planar section 145 with one or more standard electrical pads or leads 144. The electrical pads 144 disposed in the flat landing 145 at the second end 138 are connectable to other electronics (not shown) in a conventional manner. The second end 138 may extend out of the structural shell 102 as shown in FIGS. 2-6 for ease in connection to other electronics.

Figure 2:
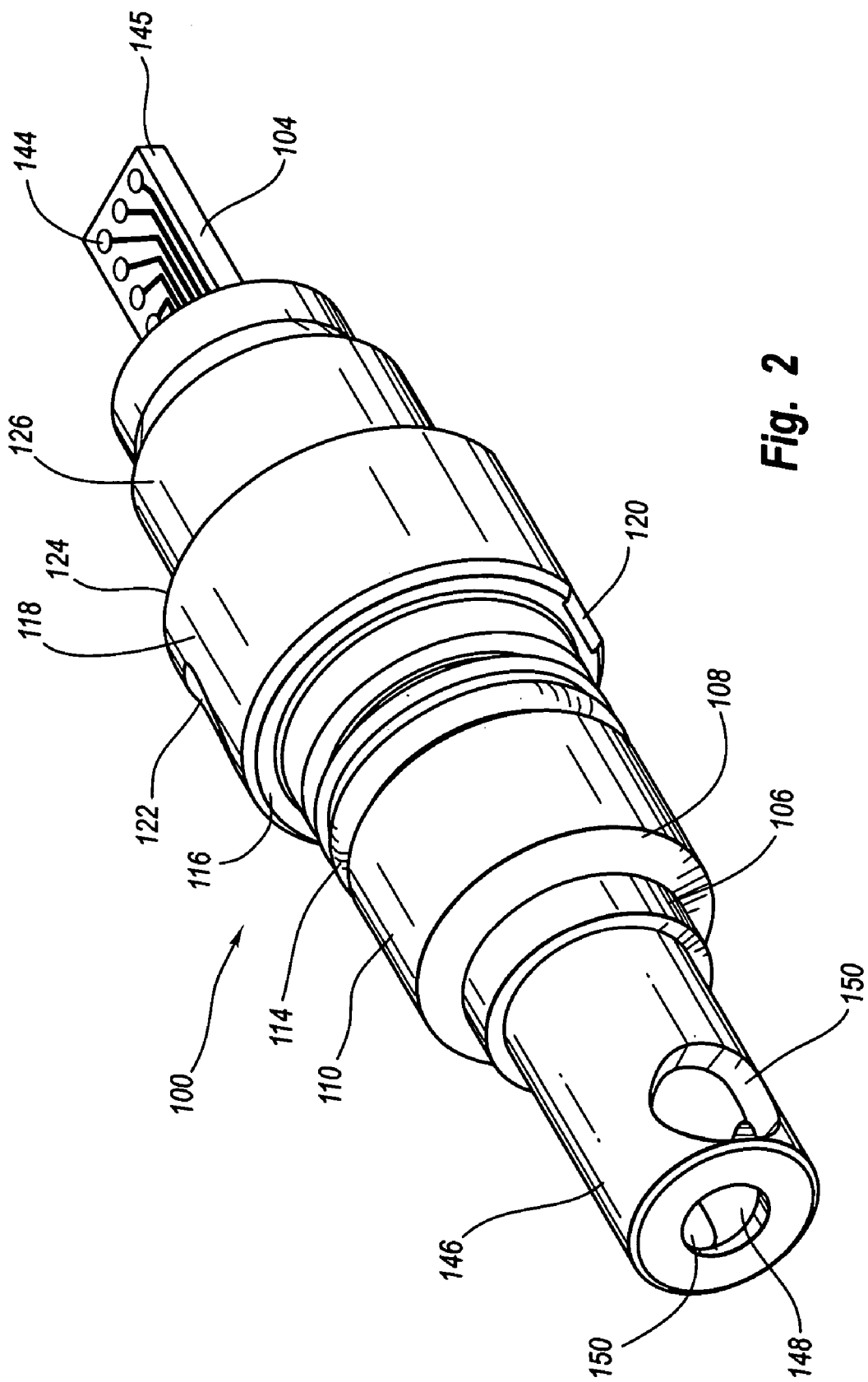
FIG. 2 is a perspective view of an assembled MEMS or sensor package for insertion into the subterranean borehole tool of FIG. 1 according to one embodiment of the present invention.

Similarly, the first end 136 of the ceramic printed circuit board 104, which is attached to the sensor 142, may extend outside of structural shell 102. It may be necessary for the sensor 142 to extend outside of the structural shell to fluidly communicate with formation fluids. However, the sensor 142 may be covered with a cap 146 as shown in FIGS. 2-4 and 6. The cap 146 is generally cylindrical and may comprise stainless steel or other materials. The cap 146 may exhibit an end hole 148 providing for fluid communication between the inside and outside of the cap 146 to the sensor 142. The cap 146 may also include a lateral through-hole 150 extending all the way through opposite sides of the cap 146 as shown in FIGS. 2-3. The through-hole 150 may provide for fluid communication to the sensor 142. The through-hole 150 may comprise an access port to fill the wire bonds between the sensor 142 and ceramic printed circuit board 104 with insulative material.

The cap 146 may also comprise a bellow-type structure (not shown) and a protective nose or cap (not shown) to protect the sensor 142 from the formation fluids. The chamber defined by the bellow-type structure and the metal cap/structural shell may then be filled with silicone oil, or a similar fluid, to transmit the pressure of the formation fluids to the sensor element 142, for example, a pressure sensor. The bellow-type structure may be electron beam (EB) welded to the stainless steel material of the cylindrical cap 146. Other types of protective barriers also may be provided to protect the sensor 142 from the formation fluids. U.S. patent application No.: 11/231,269, titled Protective Bafflers for Small Devices, with inventors Harrison et al., filed concurrently herewith and having common ownership, describes other protective barriers suitable for small devices with applications in high temperature, high pressure environments described herein, the entire contents of the aforementioned patent application are incorporated herein by reference.

According to the embodiment of FIGS. 2-6, the cap 146 overlaps with the structural shell 102. The cap 146 bears against the first internal shoulder 134 of the structural shell 102 and/or a shoulder 139 of the ceramic printed circuit board 104, and protects the sensor 142 from damage by the handling of the package 100 by operators during insertion into the downhole tool 10 (FIG. 1) or other handling. The holes 148, 150, however, ensure fluid communication between the sensor 142 and formation fluids.

However, formation fluids may be at high temperatures and/or high pressures and therefore the sensor 142 should be isolated from the electrical pads 144 of the ceramic printed circuit board 104. Therefore, according to some embodiments there is a first annular seal at the cylindrical central portion 140 of the ceramic printed circuit board 104. The structural shell 102 may include an internal recess 152 receptive of the first annular seal, such as an internal O-ring seal 154. The internal O-ring seal 154 isolates the high pressure end 136 of the ceramic printed circuit board 104 from the low pressure end 138 which is adapted for conventional electrical connection to other electronics at atmospheric conditions. Moreover, the cylindrical central portion 140 of the ceramic printed circuit board 104 comprises a first diameter adjacent to the first end 136, a second diameter adjacent to the second end 138, and a transition shoulder 156. The transition shoulder 156 interferes with the internal shoulder 135 of the structural shell 102. Therefore, as the first end 136 of the ceramic circuit board 104 is exposed to high pressure, the transition shoulder 156 tends to be forced against the internal shoulder 135 of the structural shell 102, further sealing the first end 136 from the second end 138. Accordingly, the first and second ends 136, 138 may remain isolated at high pressures, up to at least ten to twenty-five Kpsi.

Figure 6:
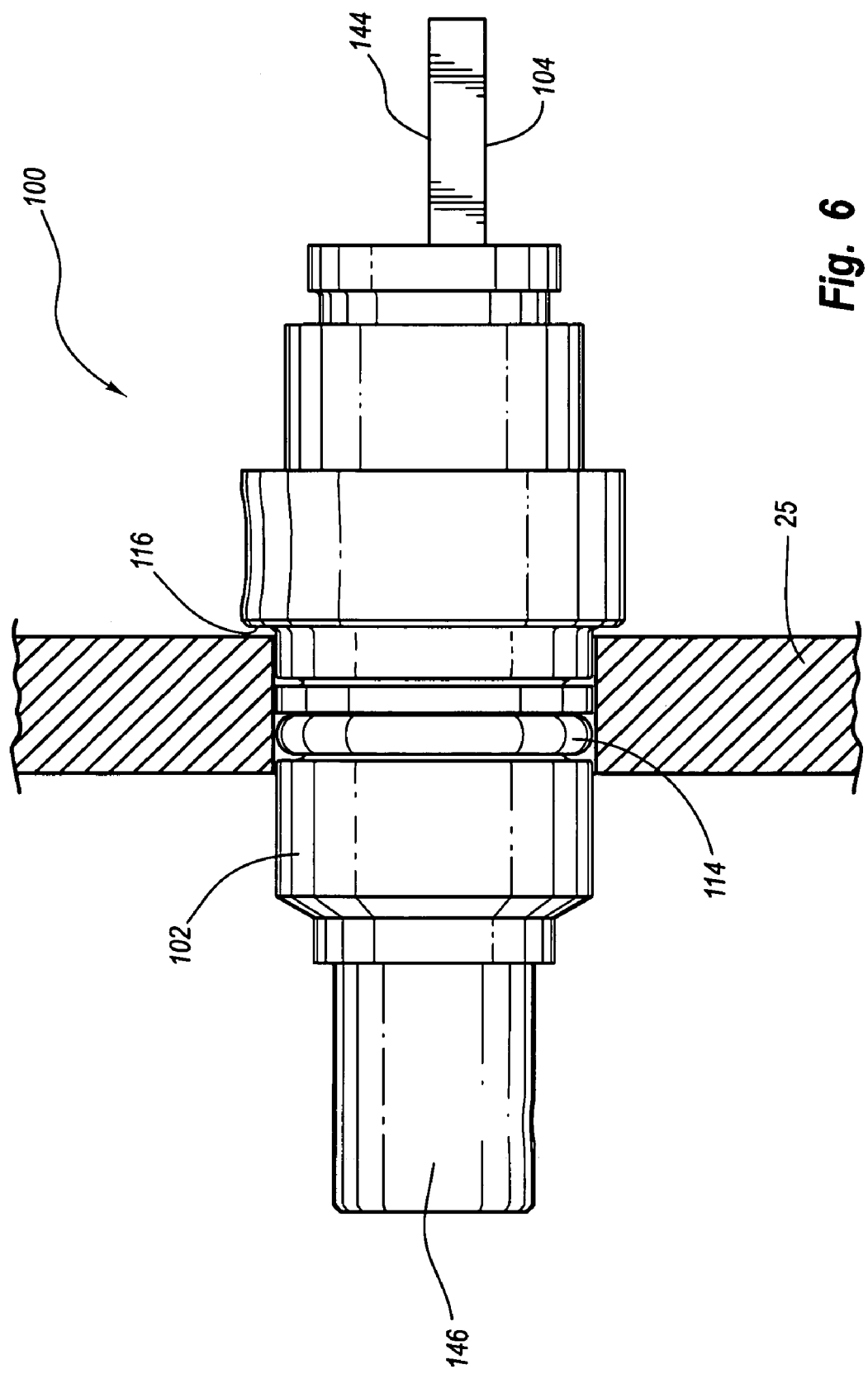
FIG. 6 is an enlarged, partial cross-sectional view of the MEMS or sensor package of FIG. 2 inserted into the fluid analysis module of FIG. 1 according to one embodiment of the present invention.

The MEMS or sensor package 100 may operate as an easily replaceable cartridge in the fluid analysis module 25 (FIG. 1) of the downhole tool 10 (FIG. 1). As shown in FIG. 6, the MEMS or sensor package 100 may be inserted across two distinct environments of the fluid analysis module 25 (FIG. 1), with the external O-ring 114 isolating the two distinct environments as well as the sensor 142 and the electrical pads 144. The second shoulder 116 of the structural shell 102 may limit insertion of the MEMS or sensor package 100 across the two distinct environments. The electrical pads 144 may be exposed to atmospheric conditions, while the sensor 142 is inserted into a formation fluid stream of the fluid analysis module 25 (FIG. 1) at high temperatures and pressures. MEMS sensor or other sensor measurements may be communicated via the electrical pads 144 of the ceramic printed circuit board 104 to processing electronics (e.g., electronics and processing module 18 (FIG. 1)).

Operation of the downhole tool 10 and MEMS or sensor package 100 according to some aspects of the invention is described below. The MEMS or sensor package 100 may be inserted into the fluid analysis module 25 across a high pressure seal created by the external O-ring 114. The sensor 142 may be exposed to the fluid flow paths of the fluid analysis module 25 or the fluid withdrawal assembly 20. The downhole tool 10 may be inserted downhole and anchored. The fluid withdrawal assembly 20 may withdraw fluid from the formation, and fluid communication is established between the sensor 142 and the formation fluids. The sensor 142 measures fluid characteristics and communicates the measurements via the electrical pads 144 of the ceramic printed circuit board 104. The electrical pads 144 may communicate with a processor such as the electronics and processing module 18 via the logging cable 15. However, the electrical pads 144 are isolated from the downhole conditions by the external O-ring seal 114 and the internal annular O-ring seal 154. Therefore, any MEMS device or any sensor may be packaged according to principles described herein and be used in a downhole or other challenging environment. Moreover, some MEMS packages or other sensor packages in accordance with the present invention avoid the use of a bulkhead to separate high and low pressures, which reduces cost and increases reliability. Sensor packaging according to some aspects of the present invention optimize the compactness of the design. For example, according to some embodiments the sensor and the electronics are on the same ceramic substrate, allowing deployment of sensors into zones which are not available with standard packaging methods.

The preceding description has been presented only to illustrate and describe the invention and some examples of its implementation. It is not intended to be exhaustive or to limit the invention to any precise form disclosed. Many modifications and variations are possible in light of the above teaching. The principles described herein may be used to create any MEMS or sensor package or fluid analysis tool usable across a pressure differential.

The preferred aspects were chosen and described in order to best explain the principles of the invention and its practical application. The preceding description is intended to enable others skilled in the art to best utilize the invention in various embodiments and aspects and with various modifications as are suited to the particular use contemplated. It is intended that the scope of the invention be defined by the following claims.

What is claimed is:

1. A MEMS or sensor package comprising:
   a structural shell;
   a ceramic printed circuit board at least partially disposed in the structural shell;
   a sensor attached and electrically connected to the ceramic printed circuit board;
   a first annular seal disposed between the ceramic printed circuit board and the structural shell; and
   a setting key disposed in the structural shell wherein the MEMS or sensor package is configured for the sensor to be at least partially disposed in a high pressure environment.

2. A MEMS or sensor package according to claim 1, wherein the setting key comprises at least one recess disposed in the structural shell ensuring a certain orientation for the MEMS or sensor package when inserted into a downhole tool.

3. A MEMS or sensor package comprising:
   a structural shell;
   a ceramic printed circuit board at least partially disposed in the structural shell;
   a sensor attached and electrically connected to the ceramic printed circuit board;
   a first annular seal disposed between the ceramic printed circuit board and the structural shell; and
   an internal recess disposed in the structural shell, wherein the first annular seal is disposed in the internal recess and wherein the MEMS or sensor package is configured for the sensor to be at least partially disposed in a high pressure environment.

4. A MEMS or sensor package comprising:
   a structural shell;
   a ceramic printed circuit board at least partially disposed in the structural shell, wherein the ceramic printed circuit board comprises,
      a first end, the sensor attached to the first end;
      a second end comprising electrical pads;
      a cylindrical central portion, the cylindrical central portion comprising a first diameter adjacent to the first end, a second diameter adjacent to the second end, and a transition shoulder; and
   a sensor attached and electrically connected to the ceramic printed circuit board;
   a first annular seal disposed between the ceramic printed circuit board and the structural shell, wherein the MEMS or sensor package is configured for the sensor to be at least partially disposed in a high pressure environment.

5. A MEMS or sensor package according to claim 4, wherein the structural shell comprises an internal shoulder, wherein the internal shoulder bears against the transition shoulder of the ceramic printed circuit board.

6. A MEMS or sensor package comprising:
   a structural shell;
   a ceramic printed circuit board at least partially disposed in the structural shell, wherein the ceramic printed circuit board comprises;
      a cylindrical middle portion;
      a step disposed in a first end and attached to the sensor;
      a flat landing disposed in a second end and extending out of the structural shell, the flat landing comprising one or more electrical pads; and
   a sensor attached and electrically connected to the ceramic printed circuit board;
   a first annular seal disposed between the ceramic printed circuit board and the structural shell, wherein the MEMS or sensor package is configured for the sensor to be at least partially disposed in a high pressure environment.

7. A MEMS or sensor package according to claim 6, further comprising interfering shoulders disposed in the ceramic printed circuit board and the structural shell.

8. A MEMS or sensor package according to claim 1, further comprising interfering shoulders disposed in the ceramic printed circuit board and the structural shell, wherein pressure at the sensor tends to tighten the first annular seal.

9. A MEMS or sensor package according to claim 1, further comprising interfering shoulders disposed in the ceramic printed circuit board and the structural shell, wherein pressure at the sensor forces the interfering shoulders together.

10. A MEMS or sensor package comprising:
    a structural shell;
    a ceramic printed circuit board at least partially disposed in the structural shell;
    a sensor attached and electrically connected to the ceramic printed circuit board;
    a first annular seal disposed between the ceramic printed circuit board and the structural shell; and
    bonding wires connected between the sensor and the ceramic printed circuit board, wherein the bonding wires are covered with an insulating material and wherein the MEMS or sensor package is configured for the sensor to be at least partially disposed in a high pressure environment.

11. A MEMS or sensor package according to claim 1, wherein the sensor is flip chip connected to the ceramic printed circuit board, wherein flip chip connections are covered with an insulating material.

12. A MEMS or sensor package according to claim 1, further-comprising an external circumferential seal disposed in the structural shell.

13. An apparatus for analyzing fluids in a formation surrounding a borehole, comprising:
    a subterranean fluid analysis tool comprising a fluid analysis module;
    a MEMS sensor disposed in the fluid analysis module, wherein the MEMS sensor is contained by a MEMS package; the MEMS package comprising:
       a structural shell;
       a ceramic printed circuit board at least partially disposed in the structural shell and electrically connected to the MEMS sensor;
       a first annular seal disposed between the ceramic printed circuit board and the structural shell, the first annular seal adapted to isolate a first portion of the ceramic circuit printed circuit board that is attached to the MEMS sensor from a second portion of the ceramic printed circuit board at pressures up to at least ten Kpsi, wherein the MEMS package is configured for at least a part of the first portion of the ceramic printed circuit board and the MEMS sensor to be disposed in a high pressure environment.

14. An apparatus for analyzing fluids in a formation surrounding a borehole according to claim 13, wherein the MEMS sensor comprises one or more of: a temperature sensor, a density sensor, a pressure sensor, and a viscosity sensor.

15. An apparatus for analyzing fluids in a formation surrounding a borehole according to claim 13, wherein the MEMS sensor is adapted to operate at pressures up to at least twenty-five Kpsi and temperatures up to at least two-hundred degrees C.

16. An apparatus for analyzing fluids in a formation surrounding a borehole according to claim 13, wherein the MEMS sensor is inserted across a high pressure seal isolating the MEMS sensor from MEMS sensor electrical contact pads.

17. An apparatus for analyzing fluids in a formation surrounding a borehole according to claim 13 wherein the subterranean fluid analysis tool comprises a fluid sample withdrawal system.

18. An apparatus for analyzing fluids in a formation surrounding a borehole according to claim 13 wherein the subterranean fluid analysis tool establishes fluid communication between formation fluids and the MEMS sensor.

19. A high temperature, high pressure downhole sensor, comprising:
   a generally cylindrical ceramic circuit board having first and second portions and a first shoulder;
   a sensor attached to the first portion for exposure to a high pressure environment;
   an electrical component section attached to the second portion and exposed to atmospheric pressure;
   a shell housing the ceramic circuit board and having a second shoulder bearing against the first shoulder of the ceramic circuit board; and
   a seal isolating the first portion from the second portion.

20. A high temperature, high pressure downhole sensor according to claim 19, wherein the sensor is a MEMS device.

21. A high temperature, high pressure downhole sensor according to claim 19, further comprising an orientation setting key disposed in an outer surface of the shell housing.

22. A high temperature, high pressure downhole sensor according to claim 19 wherein the generally cylindrical ceramic circuit board comprises a flat planar section comprising electrical pads disposed in the second portion.

23. A high temperature, high pressure downhole sensor according to claim 19 wherein the sensor is attached to the generally cylindrical ceramic circuit board with wire bonds, and wherein the wire bonds are filled with an electrical insulating material.

24. A high temperature, high pressure downhole sensor according to claim 19, wherein the high pressure environment comprises a subterranean environment and the sensor further comprising a cpa having a hole covering the sensor.

* * * * *